US011742811B2

United States Patent
Ivanov et al.

(10) Patent No.: US 11,742,811 B2
(45) Date of Patent: Aug. 29, 2023

(54) OPERATIONAL AMPLIFIER OFFSET TRIM

(71) Applicant: TEXAS INSTRUMENTS INCORPORATED, Dallas, TX (US)

(72) Inventors: Vadim Valerievich Ivanov, Tucson, AZ (US); Srinivas K. Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 13 days.

(21) Appl. No.: 17/094,847

(22) Filed: Nov. 11, 2020

(65) Prior Publication Data

US 2021/0067114 A1    Mar. 4, 2021

Related U.S. Application Data

(63) Continuation of application No. 16/275,105, filed on Feb. 13, 2019, now Pat. No. 10,868,504.

(60) Provisional application No. 62/752,576, filed on Oct. 30, 2018.

(51) Int. Cl.
*H03F 3/45* (2006.01)

(52) U.S. Cl.
CPC ... *H03F 3/45179* (2013.01); *H03F 2200/375* (2013.01); *H03F 2203/45042* (2013.01); *H03F 2203/45044* (2013.01); *H03F 2203/45212* (2013.01)

(58) Field of Classification Search
CPC ........... H03F 3/45179; H03F 2200/375; H03F 2203/45042; H03F 2203/45044; H03F 2203/45212; H03F 2203/45624; H03F 3/45771; H03F 3/45192; H03F 3/45775; H03M 1/0607; H03M 1/808
See application file for complete search history.

(56) References Cited

U.S. PATENT DOCUMENTS

| 5,134,400 A * | 7/1992 | Hash ............... H03M 1/068 341/154 |
| 2002/0008653 A1 | 1/2002 | Nishimura |
| 2013/0342273 A1 | 12/2013 | Petrie |

* cited by examiner

*Primary Examiner* — Jung Kim
(74) *Attorney, Agent, or Firm* — John R. Pessetto; Frank D. Cimino

(57) ABSTRACT

An integrated circuit (IC) includes first, second, third, and fourth transistors, first and second current source devices, and a trim circuit. The first transistor has a first control input and a first current terminal. The second transistor has a second control input and a second current terminal. The third transistor had a third control input and third and fourth current terminals. The fourth transistor has a fourth control input and fifth and sixth current terminals. The first current source is coupled between a first power supply node and the third current terminal. The second current source is coupled between the first supply node and the fifth current terminal. The trim circuit is coupled between the fourth current terminal and a second power supply node, and is coupled between the sixth current terminal and the second power supply node. The trim circuit includes a resistive digital-to-analog converter (RDAC) circuit.

4 Claims, 3 Drawing Sheets

OPERATIONAL AMPLIFIER OFFSET TRIM

CROSS-REFERENCE TO RELATED APPLICATIONS

This continuation application claim priority to U.S. patent application Ser. No. 16/275,105, filed Feb. 13, 2019, which application claims priority to U.S. Provisional Application No. 62/752,576, filed Oct. 30, 2018, both of which are hereby incorporated by reference in theft entirety.

BACKGROUND

For an input stage of an operational amplifier (op amp), an offset voltage may be present on one of the input terminals relative to the other input terminal. Ideally, the offset voltage should be 0V, but in practice will be other than 0V due to the component mismatches. As a result, a current mismatch through the op amps input stage will be present. Through a trimming process, a non-zero differential voltage will need to be imposed on the op amp's input stage to correct for the current mismatch.

SUMMARY

In one example, integrated circuit includes first, second, third, and fourth transistors, first and second current source devices, and a trim circuit. The first transistor has a first control input and a first current terminal. The second transistor has a second control input and a second current terminal. The third transistor had a third control input and third and fourth current terminals. The fourth transistor has a fourth control input and fifth and sixth current terminals. The first current source is coupled between a first power supply node and the third current terminal. The second current source is coupled between the first supply node and the fifth current terminal. The trim circuit is coupled between the fourth current terminal and a second power supply node, and is coupled between the sixth current terminal and the second power supply node. The trim circuit includes a resistive digital-to-analog converter (RDAC) circuit.

In another example, a method includes obtaining a trim code from a storage device on an integrated circuit (IC). Based on the trim code, the method includes controlling switches within a resistive digital-to-analog converter (RDAC) circuit coupled in parallel with a first resistive device and a second resistive device, and configured to be coupled between a first current terminal of a first transistor and a power supply node and to be coupled between a second current terminal of a second transistor and the power supply node.

In yet another example, a circuit includes a first transistor having a first control input to receive a first input signal, and having a first current terminal. The IC also includes a second transistor having a second control input to receive a second input signal, and having a second current terminal. The IC includes third and fourth transistors. The third transistor has a third control input and third and fourth current terminals. The fourth transistor has a fourth control input and fifth and sixth current terminals. The IC further includes first and second current source devices. The first current source device is coupled between a first power supply node and the third current terminal. The second current source device is coupled between the first power supply node and the fifth current terminal. A first resistor is coupled between the sixth current terminal and a second power supply node. A second resistor is coupled between the fourth current terminal and the second power supply node. A trim circuit is coupled between the first power supply node and the fourth current terminal, and is coupled between the first power supply node and sixth current terminal. The trim circuit includes a current digital-to-analog converter (IDAC) circuit.

In another example, a method includes obtaining a trim code from a storage device on an integrated circuit (IC). Based on the trim code, the method includes controlling switches within a current digital-to-analog converter (IDAC) circuit coupled to a first resistive device and to a second resistive device.

BRIEF DESCRIPTION OF THE DRAWINGS

For a detailed description of various examples, reference will now be made to the accompanying drawings in which.

DETAILED DESCRIPTION

Trimming the offset voltage has conventionally been done by trimming the resistance of resistors or by trimming a current, but both trimming modalities use a set of binary-weighted resistors (R, 2R, 4R, ..., $2^N R$, where N represents the number of bits in the trim code used to trim the resistors or current). The total size of the binary-weighted resistors is quite large and thus leads to an increased cost for the integrated circuit (IC).

The examples described herein avoid the use of a binary-weighted set of resistors and thus the overall trim circuit is smaller and less costly than would otherwise have been the case if with the use of binary-weighted resistors. One example uses a resistive digital-to-analog converter (RDAC) to trim the offset voltage. Another example uses a current digital-to-analog converter (IDAC) to trim the offset voltage.

Figure 1:
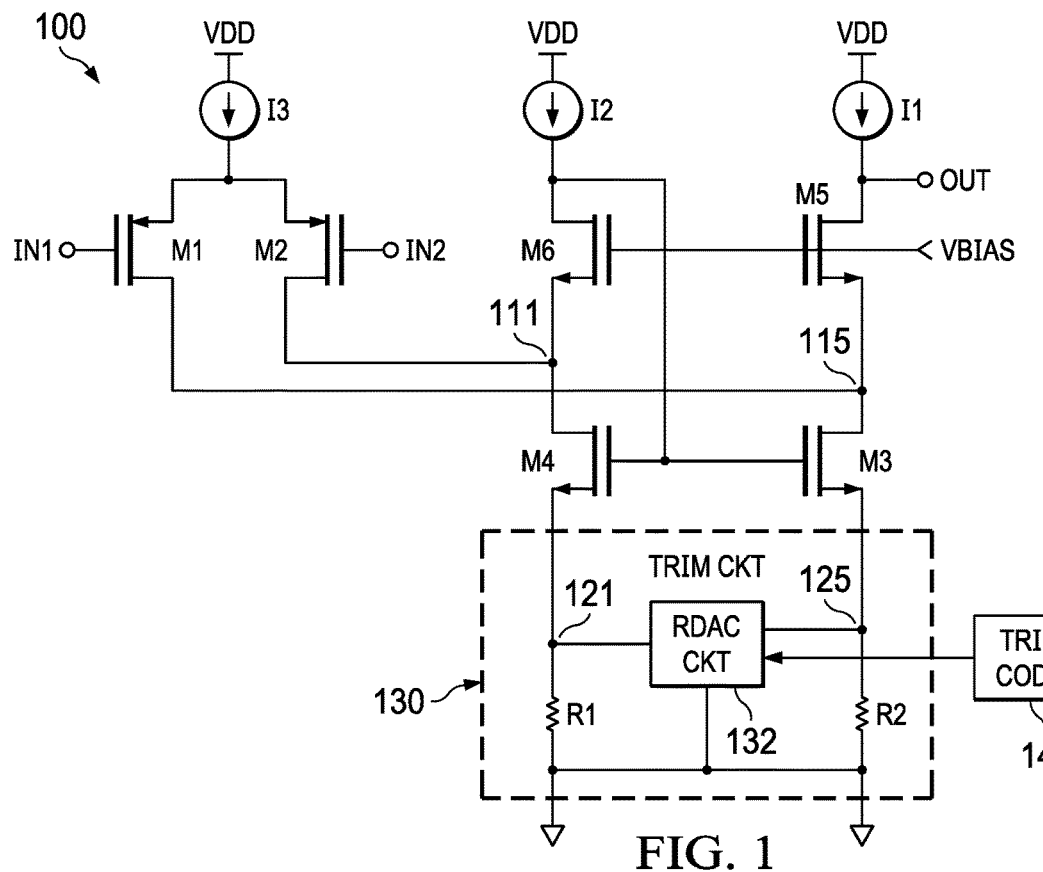
FIG. 1 illustrates a schematic for at least a portion of an op amp comprising a trim circuit which includes a resistive digital-to-analog converter (RDAC).

FIG. 1 shows a circuit 100. Circuit 100 represents an input stage to an op amp, although the trim techniques described herein apply to other types of circuits besides op amps. Circuit 100 includes transistors M1, M2, M3, M4, M5, and, M6, current source devices I1, I2, and I3, and trim circuit 130. In this example, transistors M1 and M2 comprise p-type metal oxide semiconductor field effect transistors (pMOS), and transistors M3-M6 comprise n-type metal oxide semiconductor field effect transistors (nMOS), although examples include different types of transistors nMOS instead of pMOS, and vice versa, bipolar junction transistors instead of MOS devices, and so forth. Each of current source devices I1-I3 comprises one or more transistors whose drain current is controlled to a predetermined level.

A transistor includes a control input and a pair of current terminals. In the case of a MOS device, the transistor includes a gate, a drain and a source. In the case of a bipolar junction device, the transistor includes a base, an emitter, and a collector. References are made herein to gates, drains and sources because the transistors shown in the figures comprise MOS devices, but in general, the principles apply to transistor control inputs and current terminals.

The sources of M1 and M2 are coupled together and to the power supply node (VDD) via current source I3. The gate of M1 is configured to receive a first input signal (IN1) and the gate of M2 is configured to receive a second input signal (IN2). The gates of M5 and M6 are coupled together and receive a bias voltage (VBIAS). The output signal (OUT) from the op amp is taken as the voltage on the drain of M5 (the node between I1 and M5). The drain of M5 is coupled to VDD via current source I1, and the drain of M6 is coupled to VDD via current source I2. The source of M5 is coupled to the drain of M3 at node 115, and the source of M3 is coupled to R2 at node 125. R2 is coupled to the ground node. Similarly, the source of M6 is coupled to the drain of M4 at node 111, and the source of M43 is coupled to the R1 at node 121. R1 is coupled to the ground node. The drain of M1 is coupled to the source of M5 and to the drain of M3 at node 115. The drain of M2 is coupled to the source of M6 and to the drain of M4 at node 111.

R1 and R2 are part of, or are coupled to, trim circuit 130. The trim circuit 130 also includes a resistive digital-to-analog converter (RDAC) 132. The trim circuit 132 is coupled between the source of M3 and the ground node, and also is coupled between the source of M4 and the ground node. A trim code 140 is used to configure the RDAC circuit 132 to trim the offset voltage. The trim code 140 is stored in a storage device coupled to, or provided within, the trim circuit 130. The trim code 140 can be determined through use of, for example, a test fixture to which the op amp is coupled. The trim code can be iteratively determined by incrementing or decrementing the trim code from an initial state and measuring a current produced by the op amp under a test setting (e.g., connection of a known voltage or current to the op amp's input terminal). Once the measured current (or voltage) reaches a predefined state, the trim code at that point is loaded into memory (e.g., one-time programmable memory) on the die containing the op amp.

I1 current ("I1" refers both to the current source device as well as to the magnitude of its current) flows through M5 and M3 to ground through the trim circuit 130. Similarly, I2 current flows through M6 and M4 to ground through the trim circuit 130. Based on the relative voltages of IN1 and IN2, current also flows from VDD through input M1 into node 115 and then to ground through trim circuit 130, as well as from VDD through transistor M2 into node 111 and to ground through trim circuit 130.

Figure 2:
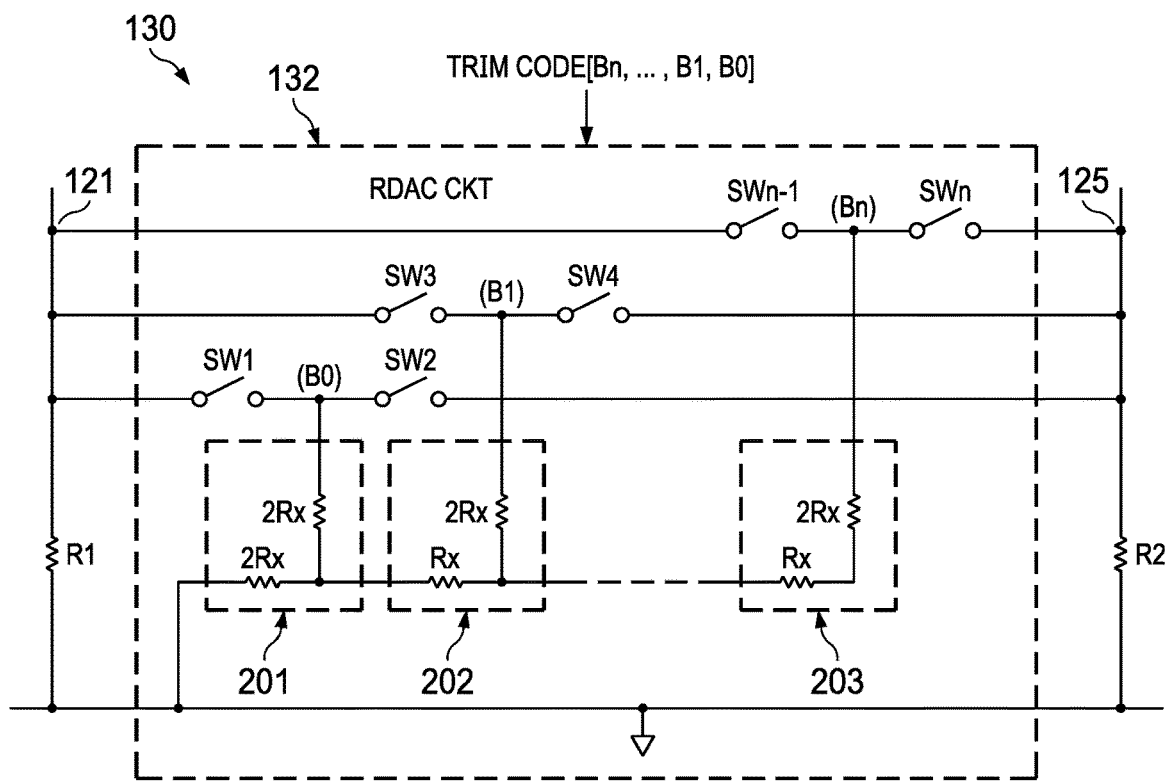
FIG. 2 shows an example of the RDAC usable in the trim circuit of FIG. 1.

Due to component mismatches, an offset voltage may be present in the signal path from I3 through M1 relative to the signal path through M2. The RDAC 132 of the trim circuit 130 trims the offset voltage to reduce it to approximately zero volts. FIG. 2 shows an example implementation of the trim circuit 130. The RDAC circuit 132 includes an R-2R ladder which comprises multiple R-2R ladder segments 201, 202, 203. Other than ladder segment 201, the remaining ladder segments 202 and 203 include a unit resistor Rx coupled to a resistor with twice the resistance of the unit resistor (2Rx). Ladder segment 201 includes two resistors of 2Rx values.

A pair of switches is coupled in series and to each R-2R ladder segment as shown. Switch pair SW1 and SW2 is coupled in series between nodes 121 and 125, with the node between the switches coupled to one of the 2Rx resistors as shown. One of switches SW1 and SW2 is closed at any point in time depending upon a corresponding bit value of a trim code. The designation "B0" adjacent SW and SW2 indicates that bit 0 of the trim code is used to control the state of SW1 and SW2. With SW1 being closed (and SW2 open), R1 is coupled in parallel with the series combination of the 2Rx resistors of ladder segment 201. However, with SW2 being closed (and SW1 open), R2 is coupled in parallel with the series combination of the 2Rx resistors of ladder segment 201. In one example, B0 being a logic 0 causes SW1 to be closed and SW2 to be open, and B0 being a logic 1 causes SW1 to be open and SW2 to be closed (or vice versa).

Similarly, each subsequent set of switches (SW3/SW4, SWn−1/SWn) is coupled to a different ladder segment. As shown, SW3 and SW4 are coupled in series between nodes 121 and 125 with the node between the switches coupled to the 2Rx resistor of ladder segment 202. SWn−1 and SWn are also coupled in series between nodes 121 and 125 with the node between the switches coupled to the 2Rx resistor of ladder segment 203. Bit B1 of the trim code controls the state of switches SW3 and SW4 (with only one switch closed (on) at any point in time). Bit Bn (e.g., the most significant bit of the trim code) controls the on/off state of switches SWn−1 and SWn.

In the example of FIG. 2, the number of ladder segments corresponds (e.g., equals) the number of bits of the trim code. For a 5-bit trim code, for example, RDAC circuit 132 will have five R-2R ladder segments. Each ladder segment is either coupled to resistor R1 or R2 depending on the state of the corresponding trim bit.

As can be seen in FIG. 2, the resistors in the RDAC circuit 132 comprise either unit resistors Rx or 2Rx resistors. The resistors in the RDAC circuit 132 are not binary-weighted from Rx to 2RX to 4Rx, and so on, to $(2^N)*Rx$, where N is the number of bits of the trim code. The total resistance of the RDAC ladder 132 is (3N+1)/Rx. If a binary-weighted RDAC were implemented instead, the total resistance of the RDAC would be $2^{(N+2)}*R1$. For the R-2R ladder implementation of the RDAC circuit 132, the total resistance of the RDAC is (3N+1)*Rx. In some applications, the value of the unit resistor Rx in the RDAC circuit 132 is R1/3 (i.e., one-third the resistance of R1), and thus the total resistance of the RDAC circuit 132 of FIG. 2 is (3N+1)*R1/3. In the example of a 10-bit trim code (N=10), the total resistance of a binary-weighted RDAC would be 4196*R1, whereas the total resistance of the R-2R ladder RDAC of FIG. 2 would be much smaller at 31*R1/3 or approximately 10*R1. As the number of bits of the trim code increases, the relative size differential between a conventional binary-weighted RDAC and the R-2R ladder RDAC circuit 132 becomes larger.

Figure 3:
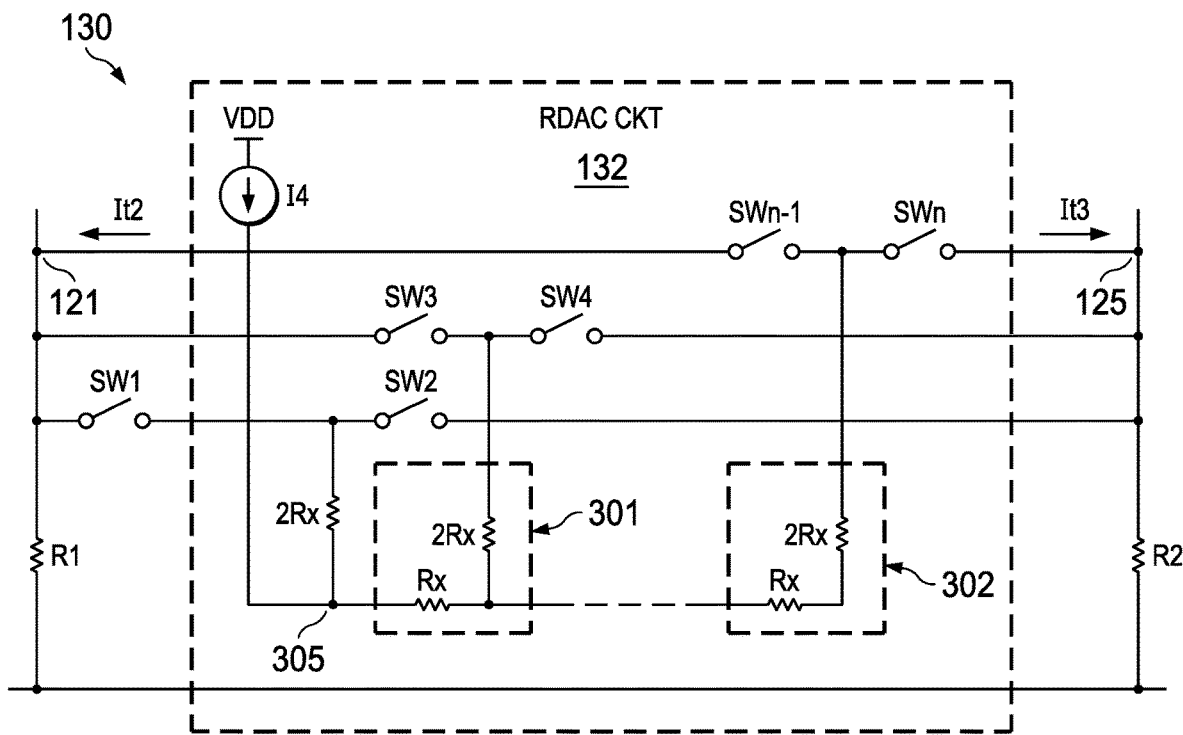
FIG. 3 shows another example of the RDAC usable in the trim circuit of FIG. 1.

FIG. 3 shows an example of trim circuit 130 that is similar to that of FIG. 2. A difference is that the RDAC circuit 132 in FIG. 3 includes a current source I4 that is coupled to node 305, instead of a 2Rx resistor being coupled to ground as in FIG. 2. The total resistor size of the RDAC circuit 132 of FIG. 3 is a little smaller than that of FIG. 2 (smaller by the size of a 2Rx resistor).

Figure 4:
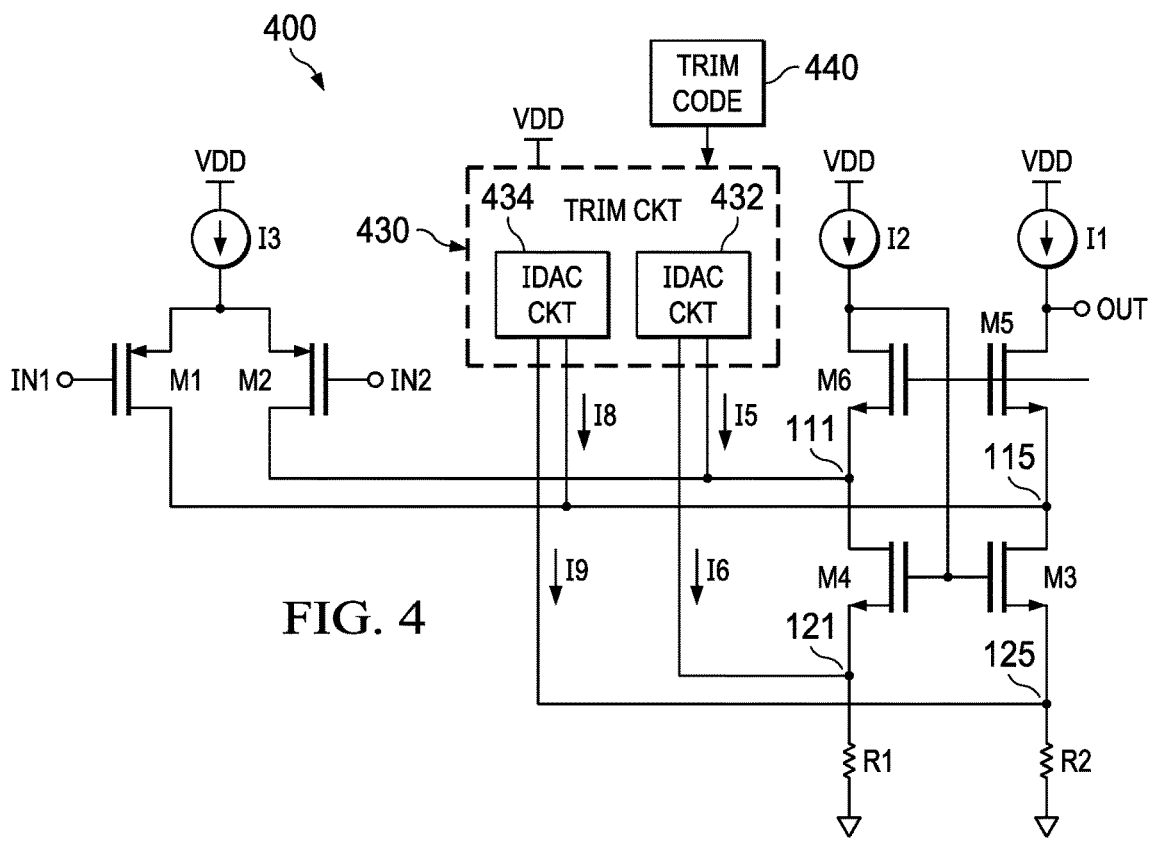
FIG. 4 illustrates a schematic for at least a portion of an op amp comprising a trim circuit which includes a current digital-to-analog converter (IDAC).

FIG. 4 shows another example of an IC 400 for which an offset voltage is trimmed. The circuit example of FIG. 4 is similar to that of FIG. 1 in that both ICs are op amps and thus include the same transistors M1-M6, resistors R1 and R2, and current sources I1-I3 coupled together as described above. A difference in FIG. 4 is trim circuit 430. Trim circuit 430 in FIG. 4 is coupled between the VDD power supply node and node 111 (source of M6 and drain of M4) and node 121 (source of M5 and drain of M3). The trim circuit 430 includes current digital-to-analog converter (IDAC) circuits 432 and 434. IDAC circuit 432 is coupled to nodes 111 and 121, and operates to inject current into both nodes 111 and 121. The magnitude of the current injected by IDAC circuit 432 into nodes 111 and 121 is based on a trim code 440. IDAC circuit 434 is coupled to nodes 115 and 125, and operates to inject current into nodes 115 and 125. The magnitude of the current injected by IDAC circuit 434 into nodes 115 and 125 is also based on a trim code 440. The same or different trim codes 440 may be provided to IDAC circuits 432 and 434. By controlling the amount of current injected into nodes 111, 115, 121, and 125, the offset voltage can be trimmed to zero or approximately zero volts. The trim code 440 is stored in non-volatile storage within the IC 400. The trim circuit 430 of FIG. 4 shows two IDAC circuits 432 and 434. In other implementation, only one IDAC circuit is used to inject current into one of nodes 111 or node 121.

Figure 5:
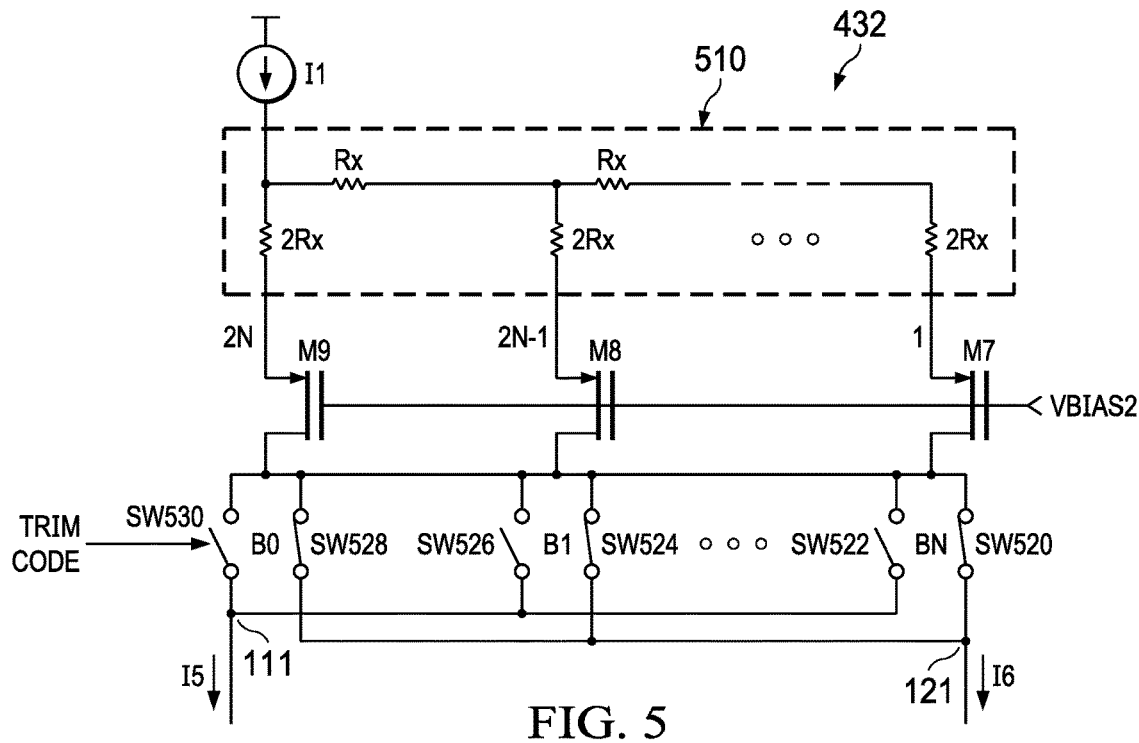
FIG. 5 shows an example of the IDAC usable in the trim circuit of FIG. 4.

FIG. 5 is a schematic of an example implementation of IDAC circuit 432. IDAC circuit 434 is implemented with the same or similar circuit. The example IDAC circuit 432 of FIG. 5 includes a current source device 17, an R-2R ladder 510, transistors M7-M9, and switches SW520-SW530. Each ladder segment of the R-2R ladder couples to a source of a corresponding transistor M7-M9. The gates of transistors M7-M9 are coupled together and receive the same bias voltage VBIAS2. Each transistor has a channel width W and a channel length L. The size of a transistor is referred by the ratio of its channel width to channel length, that is, W/L. The sizes of the transistors M7-M9 are binary-weighted. Transistor M7 has a size designated as "1" (not that its W/L equals 1, but its W/L value is normalized to 1), while the next transistor in the chain has a size of that is twice that of M7, and the next transistor after that has a size that is four times that of M7, and so on. The last two transistors, M8 and M9, have sizes that are $2^{N-1}$ and $2^N$, respectively, times the size of M7, where N is the number of bits of the trim codes. For an 8-bit trim code, the size of M9 (the ratio of its width to length) is 256 times the size of M7. The magnitude of the current that flows through each transistor is a function, in part, of the value of W/L for the transistor.

A pair of switches is coupled to the drain of each transistor M7-M9. SW520 and SW522 are coupled to the drain of M7. SW524 and SW526 are coupled to the drain of M8. SW528 and SW530 are coupled to the drain of M9. Each bit of the trim code controls one pair of the switches. For example, the least significant bit of the trim code may be used to control which of SW528 and SW530 are to be on. One of SW528 and SW530, but not both, is turned on based on the value of the trim bit. Each bit of the trim code controls a different pair of transistors. The switch of a given pair that is turned on causes current from its respective transistor to flow through that switch into either node 111 or 121 depending on which node the switch is coupled to. For all of those switches that are coupled to node 111 and turned on (by their respective trim bit), the currents from their collective transistors are added together and the aggregate current then flows into the respective node 111 or 121 to thereby trim the offset voltage.

Because an R-2R ladder is used to implement each IDAC circuit 432 and 434, the total resistor size is less than if binary-weighted transistors were used. The size analysis and benefit above with regard to the trim circuit 130 of FIG. 2 applies also to the IDAC circuit 432 of FIG. 5.

Figure 6:
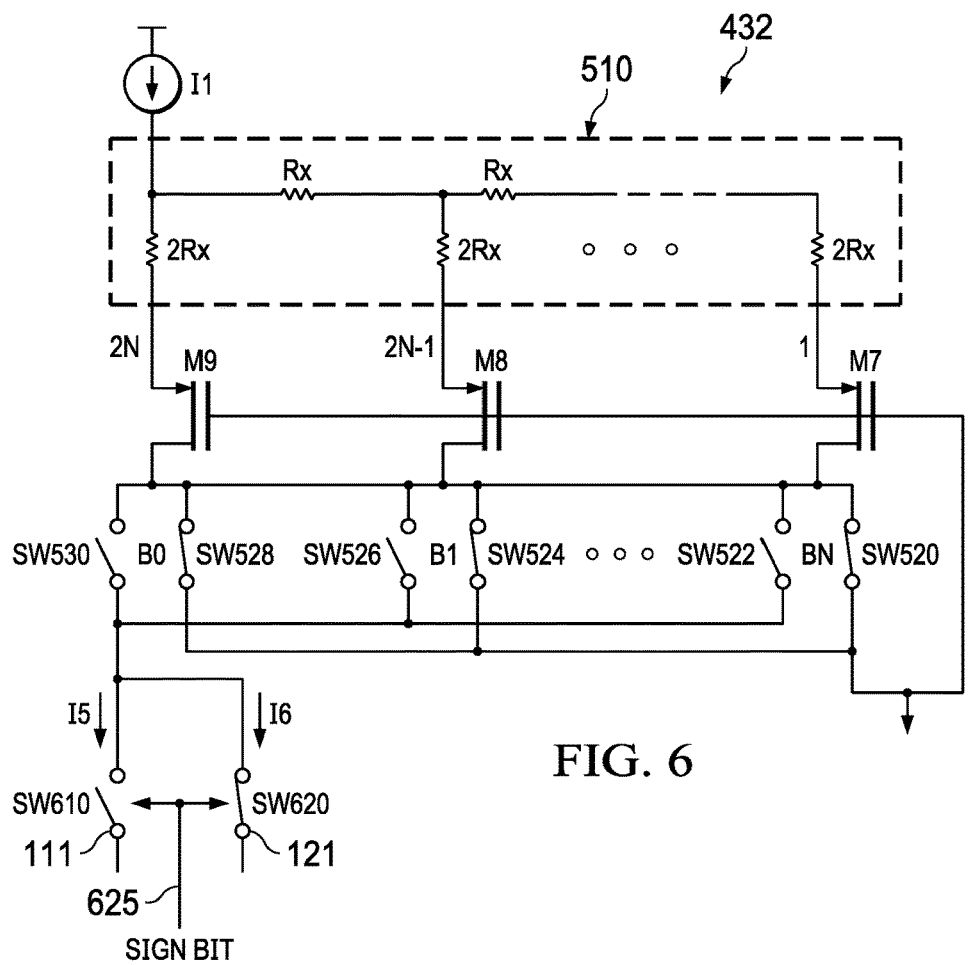
FIG. 6 shows another example of an IDAC usable in the trim circuit of FIG. 5.

FIG. 6 shows another example implementation of IDAC circuit 432 (which also can be used as an implementation for IDAC circuit 434). The example IDAC circuit of FIG. 6 is similar in some regard to that of FIG. 5, and different in other regards. The similarities include the use of current source device 17, R-2R ladder 510, transistors M7-M9, and switches SW520-SW530, all coupled the same as shown in FIG. 5. The difference is that the circuit of FIG. 6 includes additional switches SW610 and SW620. SW610 couples SW522, SW526 and SW530 to node 111, and SW620 couples SW522, SW526 and SW530 to node 121. As such, certain of the R-2R ladder segments can be connected to one of the nodes 111 or 121 depending on which of switches SW610 and SW620 is closed. A "sign" bit from the trim code is used to control the on/off state of SW610 and SW620 (only of those switches is controlled the closed/on state). Thus, the sign bit selects which node 111 or 121 the trim current is to be injected into, and the rest of the trim code is sued to control the state of switches SW520-SW530 to define the magnitude of the current correction.

Upon power cycling the op amp (or at other times), the trim code is obtained from storage within the integrated circuit comprising the op amp. Based on the trim code, switches within the RDAC or IDAC circuit (depending on the implementation) are controlled as explained above.

In this description, the term "couple" or "couples" means either an indirect or direct connection. Thus, if a first device couples to a second device, that connection may be through a direct connection or through an indirect connection via other devices and connections. Modifications are possible in the described embodiments, and other embodiments are possible, within the scope of the claims.

What is claimed is:
1. A circuit, comprising:
a first resistive device directly coupled to a first current terminal and directly coupled to a power supply terminal;
a second resistive device directly coupled to a second current terminal and directly coupled to the power supply terminal;
a resistive digital-to-analog converter (RDAC) circuit coupled between the first current terminal and the power supply terminal and coupled between the second current terminal and the power supply terminal, the RDAC circuit including an R-2R ladder, and configured to change current flowing through the first and second resistive devices;
wherein the R-2R ladder includes:
a first R-2R ladder segment;
a second R-2R ladder segment;
a first pair of switches coupled to the first R-2R ladder segment; and
a second pair of switches coupled to the second R-2R ladder segment; and
wherein one switch of the first pair is coupled between the first resistive device and a first terminal of the first R-2R ladder segment, and the other switch of the first pair is coupled between the second resistive device and the first terminal.

2. The circuit of claim 1, wherein the RDAC circuit is coupled in parallel with the first resistive device and in parallel with the second resistive device.

3. The circuit of claim 1, further comprising storage configured to store a trim code, a first bit of the trim code configured to control the first pair of switches, and a second bit of the trim code configured to control the second pair of switches.

4. The circuit of claim 3, wherein:
the first bit of the trim code identifies which switch of the first pair of switches is to be closed; and the second bit of the trim code identifies which switch of the second pair of switches is to be closed.

* * * * *